US009733573B2

United States Patent
Markle et al.

(10) Patent No.: US 9,733,573 B2
(45) Date of Patent: Aug. 15, 2017

(54) OPTICAL PROJECTION ARRAY EXPOSURE SYSTEM

(71) Applicant: Applied Materials, Inc., Santa Clara, CA (US)

(72) Inventors: David Markle, Pleasanton, CA (US); Thomas Laidig, Richmond, CA (US); Jeffrey Kaskey, Livermore, CA (US); Jang Fung Chen, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/993,071

(22) Filed: Jan. 11, 2016

(65) Prior Publication Data

US 2016/0124316 A1 May 5, 2016

Related U.S. Application Data

(63) Continuation of application No. 13/909,076, filed on Jun. 4, 2013, now Pat. No. 9,250,509.

(60) Provisional application No. 61/655,475, filed on Jun. 4, 2012.

(51) Int. Cl.
*G03F 7/20* (2006.01)
*G03B 27/42* (2006.01)

(52) U.S. Cl.
CPC ........... *G03F 7/7015* (2013.01); *G03B 27/42* (2013.01); *G03F 7/70291* (2013.01)

(58) Field of Classification Search
CPC ............................ G03B 27/42; G03F 7/70291
See application file for complete search history.

(56) References Cited

U.S. PATENT DOCUMENTS

| 5,796,526 | A | 8/1998 | Anderson |
| 6,185,016 | B1 | 2/2001 | Popovich |
| 6,238,852 | B1 | 5/2001 | Klosner |
| 6,366,335 | B1 * | 4/2002 | Hikmet ............... G02B 5/3083 349/1 |

(Continued)

FOREIGN PATENT DOCUMENTS

CN 101334590 A 12/2008

OTHER PUBLICATIONS

Chinese Office Action in related application CN 201380029365.0 dated Jul. 22, 2015.

(Continued)

*Primary Examiner* — Steven H Whitesell Gordon
(74) *Attorney, Agent, or Firm* — Patterson + Sheridan, LLP

(57) ABSTRACT

A spatial light modulator imaging system is disclosed. The system comprises an illumination module configured to provide illumination light representing data patterns to be imaged by the spatial light modulator imaging system, a projection module configured to project the illumination light to a substrate, and an illumination-projection beam separator coupled between the illumination module and the projection module, where the illumination-projection beam separator is configured to receive the illumination light along an illumination optical axis and transmit the illumination light received to the projection module along a projection optical axis, and where the illumination optical axis and the projection optical axis are substantially parallel to each other.

15 Claims, 11 Drawing Sheets

(56) References Cited

U.S. PATENT DOCUMENTS

| | | | |
|---|---|---|---|
| 7,505,208 B1 * | 3/2009 | Mitchell | G02B 5/284 359/634 |
| 2002/0036828 A1 | 3/2002 | Wong | |
| 2003/0099026 A1 | 5/2003 | Sandstrom | |
| 2005/0053847 A1 | 3/2005 | Martin et al. | |
| 2006/0139730 A1 | 6/2006 | Oehler et al. | |
| 2006/0139760 A1 | 6/2006 | Yamamoto et al. | |
| 2008/0259287 A1 | 10/2008 | Liao et al. | |
| 2009/0001292 A1 | 1/2009 | Okuyama | |
| 2009/0091730 A1 | 4/2009 | Tanaka | |
| 2009/0190101 A1 * | 7/2009 | Alasaarela | G02B 5/04 353/81 |
| 2009/0251676 A1 | 10/2009 | Komori et al. | |
| 2009/0296064 A1 | 12/2009 | Cobb et al. | |
| 2011/0074983 A1 | 3/2011 | Bush | |
| 2012/0300180 A1 | 11/2012 | Jeon et al. | |
| 2013/0130182 A1 | 5/2013 | Markle et al. | |

OTHER PUBLICATIONS

International Search Report and Written Opinion mailed on Oct. 10, 2013, for PCT Application No. PCT/US2013/044145 filed on Jun. 4, 2013, 13 pages.

Jung, Mee Suk, "Optimal Parameters for Design of Optical System in Maskless Exposure", World Journal of Engineering, vol. 6 Supplement, 2009, 2 pages.

Lee, Dong-Hee, "Optical System with 4 1-1m Resolution for Maskless Lithography Using Digital Micromirror Device", Journal of the Optical Society of Korea, vol. 14, No. 3, Sep. 2010, pp. 266-276, DOI: 10.3807/, JOSK.2010.14.3.266.

Menon, Rajesh, et al., "Maskless lithography," Materials Today, Feb. 2005, Elsevier Ltd 2005, ISSN: 1369 7021, pp. 26-33.

Smith, Henry, "Maskless lithography: photons rather than electrons," SPIE Newsroom, Nov. 12, 2008, DOI: 10 .1117/2.120081 0.1339, 2 pages, http://spie.org/x31440.xml?pf=true.

* cited by examiner

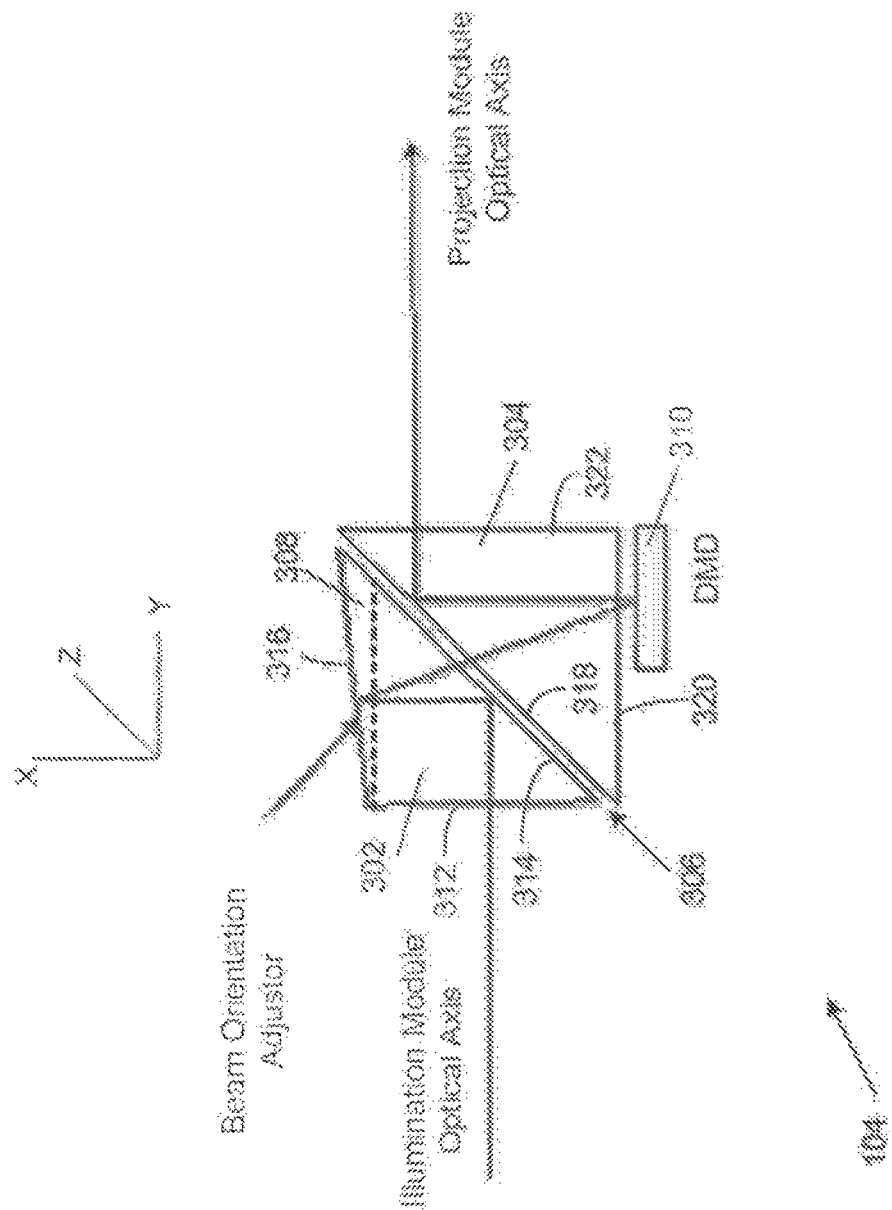

OPTICAL PROJECTION ARRAY EXPOSURE SYSTEM

CROSS REFERENCE TO RELATED APPLICATIONS

This application is a continuation of co-pending U.S. patent application Ser. No. 13/909,076 (APPM/22576), filed Jun. 4, 2013, which claims benefit of U.S. Provisional Patent Application Ser. No. 61/655,475 (APPM/22576L), filed Jun. 4, 2012, each of which is herein incorporated by reference.

FIELD OF THE INVENTION

The present invention relates to the field of lithography manufacturing. In particular, the present invention relates to a maskless digital projection exposure system.

SUMMARY

The present disclosure describes embodiments of a maskless digital projection exposure system. In one embodiment, the system comprises an illumination module configured to provide illumination light representing data patterns to be imaged by the spatial light modulator imaging system, a projection module configured to project the illumination light to a substrate, and an illumination-projection beam separator coupled between the illumination module and the projection module, where the illumination-projection beam separator is configured to receive the illumination light along an illumination optical axis and transmit the illumination light received to the projection module along a projection optical axis, and where the illumination optical axis and the projection optical axis are substantially parallel to each other. In one embodiment, a frustrated cube assembly is disclosed. The frustrated cube assembly includes a first prism, a second prism, a third prism, and a tilted mirror. The first prism includes a first surface, a second surface and a first hypotenuse. The second prism includes a third surface, a fourth surface and a second hypotenuse. The first hypotenuse and the second hypotenuse are facing one another and are separated by an air gap. The tilted mirror is adjacent the second surface and the tilted mirror and the second surface are spaced apart by an air gap.

In another embodiment, a method of forming a spatial light modulator imaging system comprises providing an illumination module to provide illumination light representing data patterns to be imaged by the spatial light modulator imaging system, providing a projection module to project the illumination light to a substrate, and providing an illumination-projection beam separator coupled between the illumination module and the projection module, where the illumination-projection beam separator is configured to receive the illumination light along an illumination optical axis and transmit the illumination light received to the projection module along a projection optical axis, where the illumination optical axis and the projection optical axis are substantially parallel to each other.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

FIG. 1 is a perspective view of a system that may benefit from embodiments disclosed herein.

FIG. 3 illustrates another exemplary illumination-projection beam separator according to embodiments of the present disclosure.

DESCRIPTION OF EMBODIMENTS

Figure 1A:
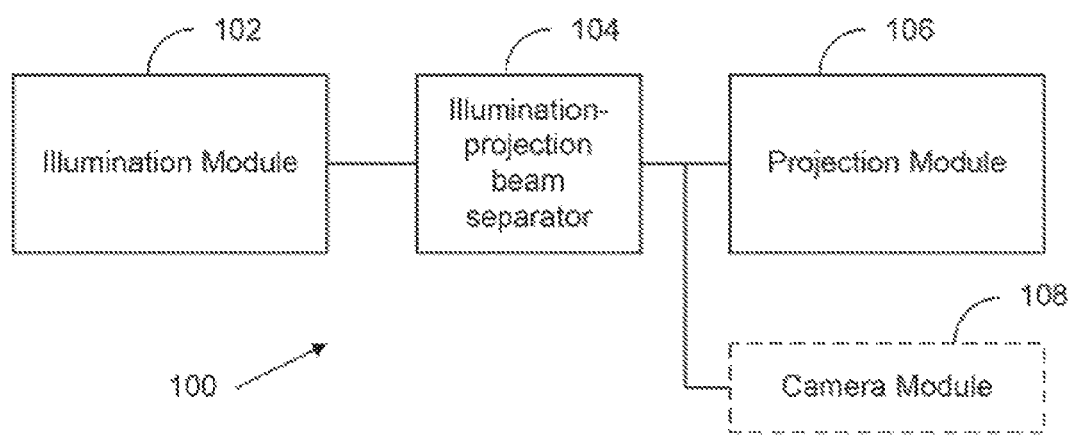
FIG. 1A illustrates an exemplary spatial light modulator (SLM) imaging unit according to embodiments of the present disclosure.

The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

For a production-worthy maskless projection exposure system, throughput has to be at least comparable to a mask-based lithography system. As mentioned, the small SLM imaging unit size limits the size of each exposure area so that a scanning system is necessary to compose the entire mask pattern. The scanning speed can be determined by several factors including the bandwidth of the pattern data pipe that feeds the SLM imaging unit, the mirror pixel tilt and settling time, the exposing scheme, the illumination intensity, etc. Regardless of how the SLM imaging unit exposure is done, a single SLM imaging unit may not be configured to match the throughput of mask-based lithography system. However, if multiple SLM imaging units are arranged in an array and configured to share the exposure load in parallel, then the system can be configured to achieve throughputs many times better than a conventional mask-based exposure system. Configuring multiple SLM imaging units into one maskless exposure system is accomplished by taking advantage of the much smaller scale of the projection and illumination optics that enable maskless exposure. In a conventional mask-based exposure system, the optical field of view size must be tailored to accommodate the entire mask area, and this leads to a very large optical system where the cost of the materials for the optics alone can be more than an order of magnitude greater than the corresponding cost for an array of SLM columns.

For multiple SLM imaging units configured in an array, each unit is designed to be physically compact in order to achieve a densely packed array formation. This compact footprint design makes it difficult to use the traditional mercury arc lamp as the illumination source due to the large physical size of the traditional mercury arc lamp and the need for heat dissipation. A better alternative design is to use solid-state diode lasers. By attaching an optical fiber to the lasing end of diode laser, an efficient propagation of pulsed laser light via the optical fiber is achieved. By bundling a group of such laser-fibers, operating at a sum of 10 Watts of total laser power, the design can be configured to have a compact illumination source that delivers sufficient intensity at the imaging plane for the SLM imaging unit. If a mercury arc lamp were used, the inherent brightness of the arc would limit the useful power obtained to a much lower value.

In addition to using a compact and efficient illumination source, the SLM imaging unit is designed to accommodate a reflective spatial light modulator and to minimize the light loss in the path from the laser diodes to the substrate. This is done by folding the light path implemented in the illumination-projection beam separator, so that light incident on the surfaces forming the air gap either exceeds the critical angle, and therefore is totally reflected, or is substantially under the critical angle, and is therefore efficiently transmitted across the air gap.

To configure a number of SLM imaging units into a tight array suited for making synchronized exposures, each unit may be designed with a compact footprint so it can be placed close to its adjacent SLM imaging units. In a projection array exposure system, exposures at each SLM imaging unit may be performed independently and in concert in order to compose the entire substrate pattern. The pattern data may be divided among the SLM imaging units and then be fed to the respective SLM imaging unit for the exposure. In one approach, the optical path for each of SLM imaging unit may be designed so that it can be readily configured and integrated into a dense exposure system array that includes multiple SLM imaging units.

FIG. 1A illustrates an exemplary spatial light modulator (SLM) imaging unit according to embodiments of the present disclosure. According to embodiments of the present disclosure, for each SLM imaging unit to function independently, multiple optical modules are used to support each SLM imaging unit. As shown in FIG. 1, SLM imaging unit 100 includes the illumination module 102, illumination-projection beam separator 104, projection module 106, and optionally the camera module 108. The illumination module 102 includes an exposure source with sufficient intensity for the intended exposure wavelength and a kaleido or light pipe to achieve uniform illumination over the SLM imaging area. The projection module 106 is configured to image pattern data onto the substrate. The optical path of the projection module 106 can be configured to be in-line (also referred to as parallel) with the main optical path of the illumination module 102 in order to form a compact footprint of the unit. That is, the illumination module 102 and projection module 106 can be constructed in a slim vertical form. The camera module 108 is configured to monitor various aspects of imaging quality of the SLM imaging unit 100, including but not limited to, focus and alignment through the lens as well as to serve as a check SLM mirror on-off behavior. Thus the camera module 108 can be configured to enable maintenance of the SLM imaging unit and to provide useful exposure variation diagnostics. In one implementation, the camera module 108 may be located in the back and towards the sides of each SLM imaging unit. Thus the SLM imaging unit can be made narrow from left to right and multiple columns can be readily packed into a compact, single-row configuration. If required the next row of SLM imaging units can be placed at a predetermined distance apart, to accommodate the extra room required by the camera module(s) 108.

Figure 1B:
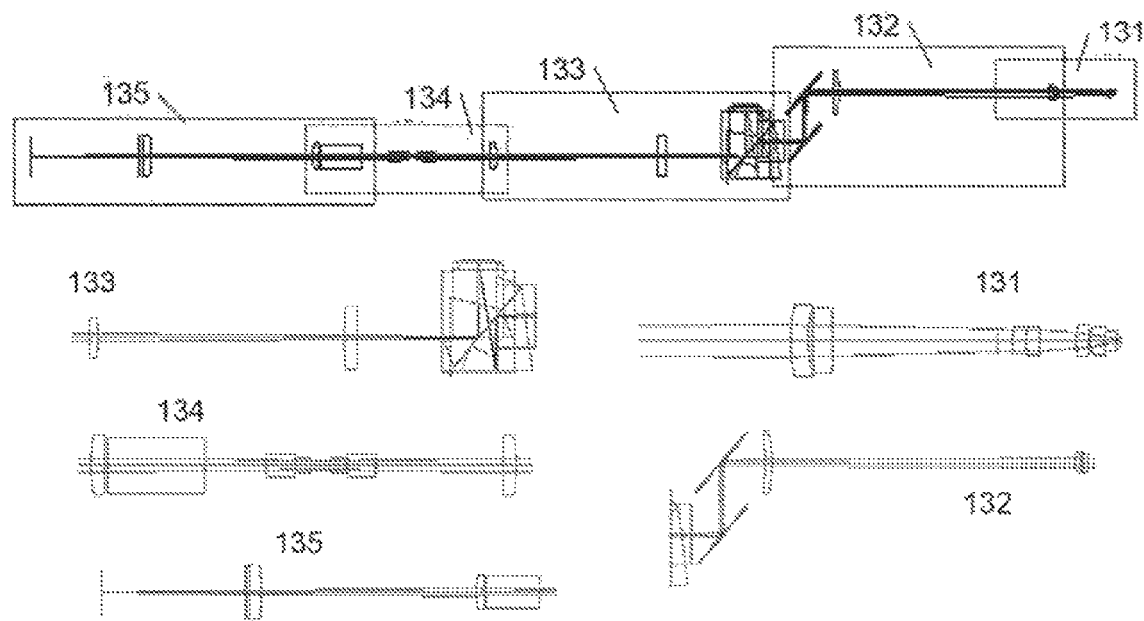
FIG. 1B illustrates an exemplary overview of optical paths in the spatial light modulator (SLM) imaging unit of FIG. 1A according to embodiments of the present disclosure.

FIG. 1B illustrates an exemplary overview of optical paths through various portions of the path from the light pipe to the substrate. Various parts of the optical path are shown with different partitions, namely 131, 132, 133, 134, and 135. Key components of each of the partitions are shown. A detailed list of the surfaces/components is provided in Table 1 below. Table 1 describes a list of components used to form the SLM imaging unit of FIG. 1A and FIG. 1B according to embodiments of the present disclosure.

TABLE 1

SURFACE DATA SUMMARY (Units in Millimeters)

| Surf | Type | Radius | Thickness | Glass | Diameter | Conic |
|---|---|---|---|---|---|---|
| OBJ | STANDARD | Infinity | 76.99117 | | 23.50306 | 0 |
| 1 | STANDARD | Infinity | 1 | SUPRASIL | 25.19697 | 0 |
| 2 | STANDARD | Infinity | 2 | | 25.21194 | 0 |
| 3 | STANDARD | −290.2887 | 6 | S-LAH66 | 25.2499 | 0 |
| 4 | STANDARD | −116.4027 | 115.911 | | 25.53362 | 0 |
| 5 | STANDARD | 40.37407 | 4 | S-FPL51 | 15.58083 | 0 |
| 6 | STANDARD | 139.9383 | 1 | | 14.93458 | 0 |
| 7 | STANDARD | Infinity | 30 | S-BSL7 | 14.75115 | 0 |
| 8 | STANDARD | Infinity | 18.69801 | | 10.27299 | 0 |
| 9 | STANDARD | 26.74097 | 9 | S-FPL51 | 5.951097 | 0 |
| 10 | STANDARD | −20.4683 | 5 | S-NSL5 | 3.964418 | 0 |
| 11 | STANDARD | 17.42661 | 2.979348 | | 2.835765 | 0 |
| 12 | STANDARD | Infinity | 2.979348 | | 2.125411 | 0 |
| 13 | STANDARD | −17.42661 | 5 | S-NSL5 | 2.849918 | 0 |
| 14 | STANDARD | 20.4683 | 9 | S-FPL51 | 3.97673 | 0 |
| 15 | STANDARD | −26.74097 | 39.13236 | | 5.960703 | 0 |
| STO | STANDARD | −139.9383 | 4 | S-FPL51 | 14.89528 | 0 |
| 17 | STANDARD | −40.37407 | 115.6297 | | 15.5402 | 0 |

TABLE 1-continued

SURFACE DATA SUMMARY (Units in Millimeters)

| Surf | Type | Radius | Thickness | Glass | Diameter | Conic |
|---|---|---|---|---|---|---|
| 18 | STANDARD | 116.4027 | 6 | S-LAH66 | 25.41056 | 0 |
| 19 | STANDARD | 290.2887 | 43.97204 | | 25.1267 | 0 |
| 20 | STANDARD | Infinity | 13 | S-BSL7 | 24.15147 | 0 |
| 21 | COORDBRK | — | 0 | | — | — |
| 22 | STANDARD | Infinity | 0 | MIRROR | 32.16165 | 0 |
| 23 | COORDBRK | — | 0 | | — | — |
| 24 | STANDARD | Infinity | −27 | S-BSL7 | 23.9619 | 0 |
| 25 | STANDARD | Infinity | −0.5 | | 23.5682 | 0 |
| 26 | STANDARD | Infinity | −2.997 | S-FSL5 | 23.55704 | 0 |
| 27 | STANDARD | Infinity | −0.483 | | 23.51244 | 0 |
| 28 | STANDARD | Infinity | 0 | | 23.50462 | 0 |
| 29 | DGRATING | Infinity | 0 | MIRROR | 23.50462 | 0 |
| 30 | STANDARD | Infinity | 0.483 | | 23.50462 | 0 |
| 31 | STANDARD | Infinity | 2.997 | S-FSL5 | 23.93682 | 0 |
| 32 | STANDARD | Infinity | 0.5 | | 25.63359 | 0 |
| 33 | STANDARD | Infinity | 40 | S-BSL7 | 26.08404 | 0 |
| 34 | STANDARD | Infinity | 0 | | 48.67878 | 0 |
| 35 | DGRATING | Infinity | 0 | MIRROR | 48.67878 | 0 |
| 36 | STANDARD | Infinity | 0 | | 24.78373 | 0 |
| 37 | STANDARD | Infinity | −21.628 | S-BSL7 | 24.78373 | 0 |
| 38 | COORDBRK | — | 0 | | — | — |
| 39 | STANDARD | Infinity | 0 | MIRROR | 33.63665 | 0 |
| 40 | COORDBRK | — | 0 | | — | — |
| 41 | STANDARD | Infinity | 18.372 | S-BSL7 | 25.10212 | 0 |
| 42 | STANDARD | Infinity | 15 | | 25.37257 | 0 |
| 43 | COORDBRK | — | 0 | | — | — |
| 44 | STANDARD | Infinity | 0 | MIRROR | 34.57223 | 0 |
| 45 | COORDBRK | — | −30 | | — | — |
| 46 | COORDBRK | — | 0 | | — | — |
| 47 | STANDARD | Infinity | 0 | MIRROR | 35.48185 | 0 |
| 48 | COORDBRK | −21.231 | | | — | — |
| 49 | STANDARD | −103.6759 | 3.5 | S-FPL51 | 26.84381 | 0 |
| 50 | STANDARD | −51.87603 | 149.7883 | | 27.10744 | 0 |
| 51 | STANDARD | 16.52846 | 2.5 | S-LAL13 | 8.829317 | 0 |
| 52 | STANDARD | 12.23028 | 0.6516637 | | 8.05797 | 0 |
| 53 | STANDARD | 29.92611 | 3 | S-FPL53 | 8.052902 | 0 |
| 54 | STANDARD | −40.07405 | 23.854 | | 7.803958 | 0 |
| 55 | STANDARD | Infinity | 2.1 | | 2.887609 | 0 pupil |
| 56 | STANDARD | 25.89648 | 2 | PBM18Y | 3.206145 | 0 |
| 57 | STANDARD | 6.411588 | 2 | S-FPL53 | 3.299604 | 0 |
| 58 | STANDARD | −15.94908 | 5.152201 | | 3.493134 | 0 |
| 59 | STANDARD | 4.910884 | 2 | S-FPL53 | 3.874677 | 0 |
| 60 | STANDARD | −143.7341 | 0.1 | | 3.532434 | 0 |
| 61 | STANDARD | 3.690008 | 2 | S-FPL51 | 3.364643 | 0 |
| 62 | STANDARD | 2.949571 | 1.8 | S-NBM51 | 2.354322 | 0 |
| 63 | STANDARD | 1.91234 | 0.5935 | | 1.399212 | 0 |
| IMA | STANDARD | Infinity | 1.20883 | | | 0 kaleido |

According to embodiments of the present disclosure, to control imaging/printing resolution, the image projection objective can be designed with an appropriate reduction factor. However, one challenge of increasing the reduction factor is that it reduces the exposure area in a quadratic fashion. This may negatively impact the exposure throughput and may substantially increase the number of pixels to be manipulated to create the data fed to the DMD. For printed circuit board (PCB) lithography, the printing resolution may be above 20 um. Hence a 1×SLM imaging unit described in the following sections with no objective reduction may be adequate, given that the native DMD mirror pixel dimension may be about 10.8 um. This scale factor can also help to ensure sufficient exposure throughput. For the LED and TSV applications, the minimum critical dimension (CD) for typical design rules may be in the range from 3 to 5 um. In this case, a 6× projection optical design described in the following sections may be employed since the printed DMD mirror dimension may be around 3 um. For these applications, multiple SLM imaging units arranged in an array configuration are used to meet the desired throughput.

According to aspects of the present disclosure, a 1× objective design and a 6× reduction objective design may be employed. Note that a wide variety of magnifications, both larger or smaller than the 1× or the 6× design, can be configured to work with the present disclosure. Both designs can be configured to share a common illumination module 102. For ease of focus and alignment, the projection objective may be designed with a common focus for all the actinic exposure wavelengths as well as the selected non-actinic wavelengths, which typically extend into the visible and sometimes into the infrared part of the spectrum. Additionally, a programmable focus stage can be mounted on the body of each SLM imaging unit to enable auto focusing, which allows the DMD image to follow the substrate surface during the exposure.

According to aspects of the present disclosure, the system is designed so that the illumination fill factor, can be monitored for every micro-mirror in the DMD array. That is, the tilt angle of each micro-mirror, which varies from on to off or from −12 degrees to +12 degree, can be checked to ensure that the on-position delivers the light incident on the mirror to the nominal center of the projection system pupil and the off-position removes most of the light incident on the mirror from the projection system pupil. The manufacturers specifications indicates that the mirror tilt angle can vary as much as ±1 degree. This means that the direction of the beam reflected from the micro-mirror may vary by as much as two degrees. This variation would shift the reflected illumination beam toward the projection system pupil edge, but most of the light would still pass through the projection system. Thus the use of a relatively small illumination fill factor ensures that the design can accommodate this mirror tilt variation. An alternate approach to reduce the sensitivity to mirror tilt angle is to design an illumination module 102 that over-fills the projection lens pupil. Underfilling the projection pupil with an illumination numerical aperture (NA) that is smaller than the projection NA is more efficient and is often referred to as employing partially coherent illumination. The partial coherence factor (σ) can be expressed as follows:

$$\sigma = (\text{NA of the illumination})/(\text{NA of the imaging objective})$$

When the NA of the illumination is the same as the NA of the objective, the σ is 1. Overfilling means that the σ is greater than 1. When σ is 1 or greater, the illumination is described as incoherent, and the resultant image is wider and exhibits less ringing beyond the first null point. For some lithography imaging applications, one approach is to have σ.apprxeq.0.5. This is because some degree of optical ringing is often desirable when a high contrast resist system is employed. The steeper image profile near the exposure threshold level results in better line-width control and the more pronounced ringing falls well below the threshold level and is not seen in the developed image. In the disclosed SLM imaging unit, a low σ factor from 0.25 to 0.27 is chosen to achieve a better resultant aerial image profile under the conditions typically employed where multiple pixels having an almost random location are superimposed. This approach may be counter-intuitive, especially when diode lasers are used as the illumination source. Unlike conventional mercury arc lamp or LED light sources, the laser light source can be highly coherent in nature. It may have the tendency to cause laser speckles that may render the distribution of light in the imaging plane to be non-uniform. With more coherent illumination, or a smaller value of σ, the non-uniformity could become worse. According to aspects of the present disclosure, the use of an illumination system having a low σ factor can be used in conjunction with pixel blending, which is a method of imaging together superimposed pixels for patterning features. This approach, not only achieves a better image edge profile, it also reduces the negative effects of mirror tilt angle errors. According to the embodiments of the present disclosure, one solution is to make use of a low σ illumination design together with diode laser illumination source; and to employ an exposure imaging process that includes superimposing multiple pixels so as to average the exposure dose over several pixels.

The illumination module 102 includes multiple laser diodes, which are optically coupled via a fiber bundle to one end of a kaleido, which lets almost all of the input light propagate to the other end. Having gone through ten or more total internal reflections inside the kaleido, the output laser illumination has been folded multiple times so as to form a uniform intensity distribution across the kaleido output face. The kaleido is mounted and centered in a fixture while retaining the total internal reflection (TIR) property that prevents light from leaking out of the kaleido sides. In order to minimize any light leak, objects that may touch one of the sides of the kaleido are minimized because they may cause an appreciable light leak.

Materials that can be used to touch the kaleido side are selected to satisfy the TIR formula shown below. Here the NA refers to incoming fiber output numerical aperture, which may typically be about 0.22. N1 refers to the refraction index of the kaleido, which may be made of fused silica having a refraction index near 1.47 at approximately 405 nm wavelength. The formula predicts that the refractive index of the selected material, N2 that can safely touch the kaleido, can have a refraction index below 1.45 at approximately 405 nm. Teflon film such as FEP and an inorganic MgF2 coating material have this property and therefore may be suitable for this application. The NA may be computed with the following mathematical expression:

$$NA \leq \sqrt{(N1)^2 - (N2)^2}$$

According to aspects of the present disclosure, one approach is to use a holder that sandwiches a kaleido between two sheets of about 5 mil FEP (Teflon) film using a pair of grooved metal jaws, which can be tightened with screws to hold the kaleido firmly. The FEP film "cladding" may be used because its refractive index is low enough to maintain a total internal reflection. Other embodiments may include pre-coating the kaleido with a low index material to ensure internal reflection, then gripping it without damaging the sub-surface of the coating. For the coating material, it may be FEP Teflon or MgF2. The coating can be thick enough to allow some margin of error without significant loss of reflectivity. For example, the coating thickness can be set to exceed at least 10 exposure wavelengths. Instead of coating the kaleido, another approach is to coat the sides of the holding fixture with several microns of Teflon film.

Figure 7:
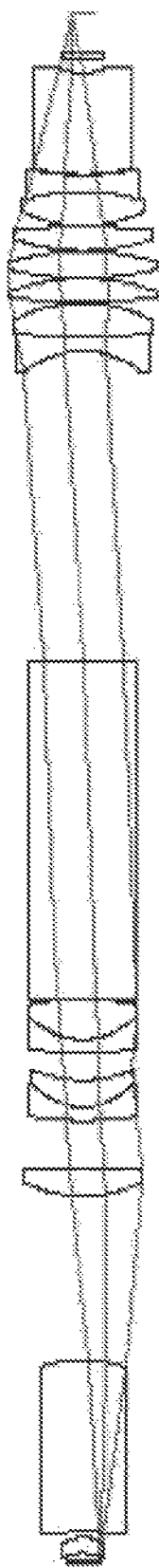
FIG. 7 illustrates exemplary 6× camera optics according to embodiments of the present disclosure.

The following paragraphs describe two types of projection module 106 designs, one with a 1× magnification in the projection system, the second with a 6× magnification projection system that reduces the mirror pixel size of approximately 10.8 um by 6 times to approximately 1.8 um on the substrate. FIG. 1A and Table 1 above describe an exemplary implementation of the 1× optical system including the illumination module 102 and projection module 106. The 6× system may share a common illumination module 102 with the 1× system. The projection module 106 is further described in FIG. 5 and Table 2. An example of the camera module 108 is illustrated in FIG. 7 and described in Table 3. The following is a summary of the design data.

The basic optical system parameters can be summarized as shown:

|  | 1X Projection | 6X Projection |
| --- | --- | --- |
| Working distance | 76.99 mm | 6 mm |
| Overall Length | 542.27 mm | 386 mm |
| Object NA | .04 | 0.24 |
| Image NA | .04 | 0.04 |

Both designs can be configured to be doubly telecentric that have very low distortion across the field (i.e. much less than 0.1%), and may be well corrected at approximately 400 nm, 405 nm, 410 nm, and 633 nm. The 1× design may also be corrected at approximately 550 nm, which is the intended alignment wavelength for this system, whereas the 6× system is corrected at approximately 940 nm for alignment. The exposure radiation spectrum can be in the 400-410 nm part of the spectrum, which explains why there are 3 corrected wavelengths in this band. The lens can be built and adjusted using a phase measurement interferometer operating at the HeNe laser wavelength at 6328 Angstroms. Note that in some cases the corrected wavelength range spans more than a factor of 2 and the glasses may be chosen based on the specific design criteria. For example, in the 1× case, the wavefront correction can be approximately 0.05 wave root-mean-square (RMS) or better from 380 nm to 1050 nm, which is about a factor of 3 in wavelength span. See FIGS. 4, 6, and 8. Note that one feature of both designs is that they maintain a flat window between the image plane and the first lens element. This is done in anticipation that the window may eventually become coated with residue resulting from the vapors released during the resist exposure process and they may be replaced and serviced.

According to aspects of the present disclosure, telecentricity on the image side of the lenses is implemented in the disclosed design in order to prevent small magnification changes with focal position. Although telecentricity may not be required on the object side, it can simplify the illuminator design and improve performance and illumination uniformity from the digital micro-mirror devices.

Note that some lithography applications may require substantially precise superposition of many different patterns, often imaged by different lithography tools. This overlay accuracy can be a small fraction of the minimum feature size, so variations in distortion from one lithography tool to another can consume the entire overlay budget leaving nothing for the alignment budget. Thus in addition to keeping the distortion very low across the field in the exposure part of the spectrum, the disclosed implementation may also be configured to keep distortion small at the alignment wavelength, which is usually located at the other end of the spectrum. Another reason the disclosed design is implemented with low distortion is to support seamless image stitching between the adjacent SLM imaging units. According to embodiments of the present disclosure, both the 1× and 6× designs may share a common illumination module and an illumination-projection beam separator located adjacent to the micro-mirror array (also referred to as a Digital Micro-mirror Device (DMD)).

Figure 2A:
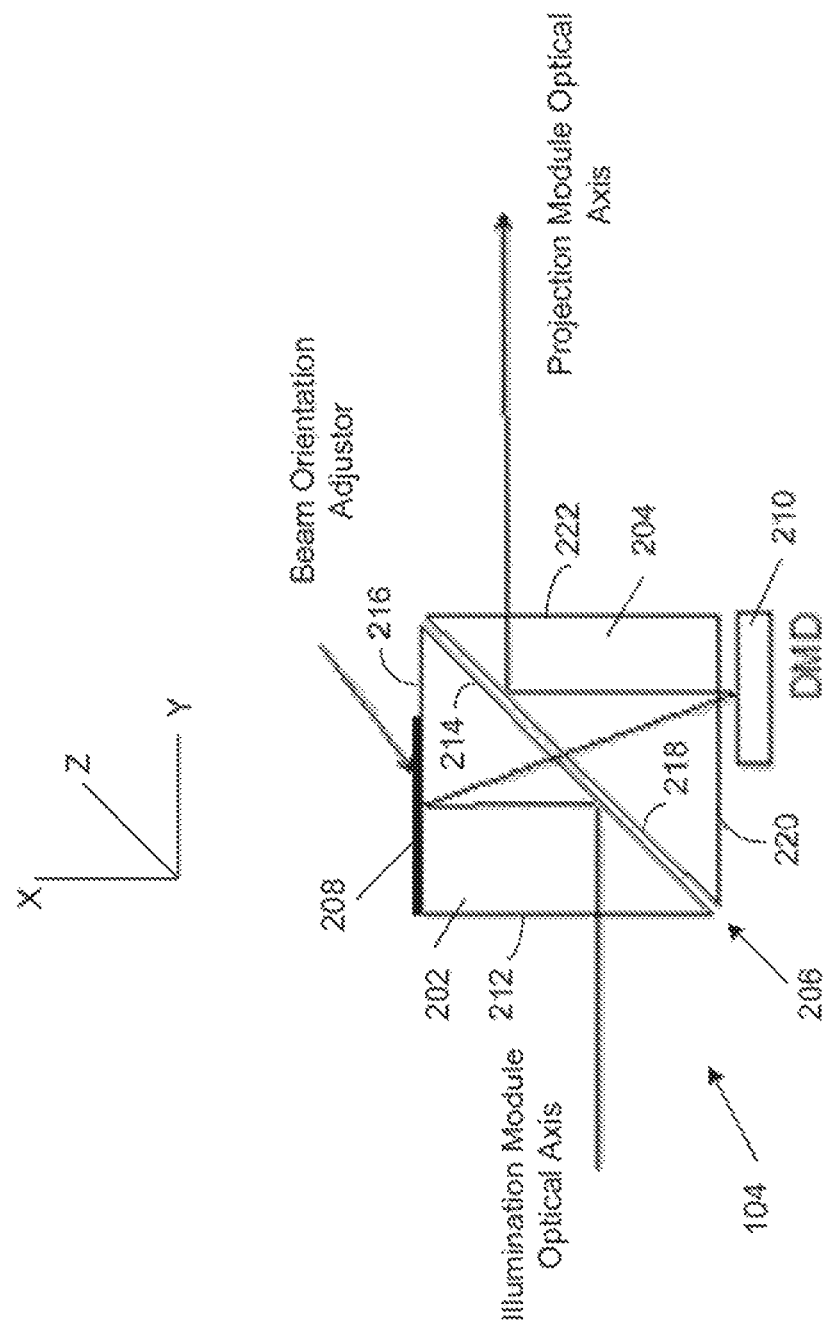
FIG. 2A illustrates an exemplary two dimensional view of an illumination-projection beam separator according to embodiments of the present disclosure.

FIG. 2A illustrates an exemplary optical path in an illumination-projection beam separator according to embodiments of the present disclosure. As shown in FIG. 2A, the illumination-projection beam separator 104 can be formed with two prisms 202 and 204 arranged with the hypotenuse surfaces facing each other and with a very small air gap 206 between them, for example in the range of 0.005 to 0.015 millimeter. One surface of the prism 202 may be attached to a beam orientation adjustor 208, which may be implemented as a reflective grating surface. Light incident on the air gap surfaces at 45 degrees is reflected at 90 degrees to its original direction. Light incident on the air gap surfaces at an angle closer to normal incidence passes through the air gap 206 without being reflected. In one approach, the illumination-projection beam separator 104 is arranged so that light from the illumination module 102 that is directed at the micro-mirror array 210 (also referred to as digital micro-mirror device) at about 24 degrees from normal incidence in air hits the S-BSL7 glass-air gap surfaces at an incidence angle below the critical angle of 40.81° and therefore passes through the gap un-deviated. Light reflected from the micro mirror array 210 at near normal incidence strikes the air gap surfaces at about 45 degrees and is therefore configured to be reflected along the projection module optical axis. Thus the illumination-projection beam separator 104 separates the incident illumination beam from the reflected projection system beam with high efficiency and without taking very much space.

According to aspects of the present disclosure, a smaller footprint may be achieved by making the illumination module optical axis and the projection module optical axis substantially parallel to each other. One implementation is to apply a beam orientation adjustor 208, which may be implemented as a reflective grating surface to the surface opposite the DMD. As a result, the illumination-projection beam separator 104 folds the illumination module optical axis to be substantially parallel to the projection module optical axis. In addition, the illumination-projection beam separator 104 straightens out the DMD focal plane tilt. The grating period and diffraction order can be selected to generate an approximately 24° incidence angle in air in one implementation of the DMD 210. The mirrors on the DMD pivot in an azimuth plane rotated about 45° with respect to the section shown, and the rows and columns of mirrors on the DMD surface. The design is configured to rotate the grating surface about the Y-axis so the light diffracted from the mirror grating is diffracted at a compound angle in the space between the reflective grating and the DMD 210. In other implementations, the DMD 210 can also be represented as a rotated grating, which then restores the direction of the optical axis. Note that in yet other implementations, the beam orientation adjustor 208 may be configured to accommodate different incidence angles (such as 22°, 26°, 28°, etc.) to the DMD 210.

Figure 2B:
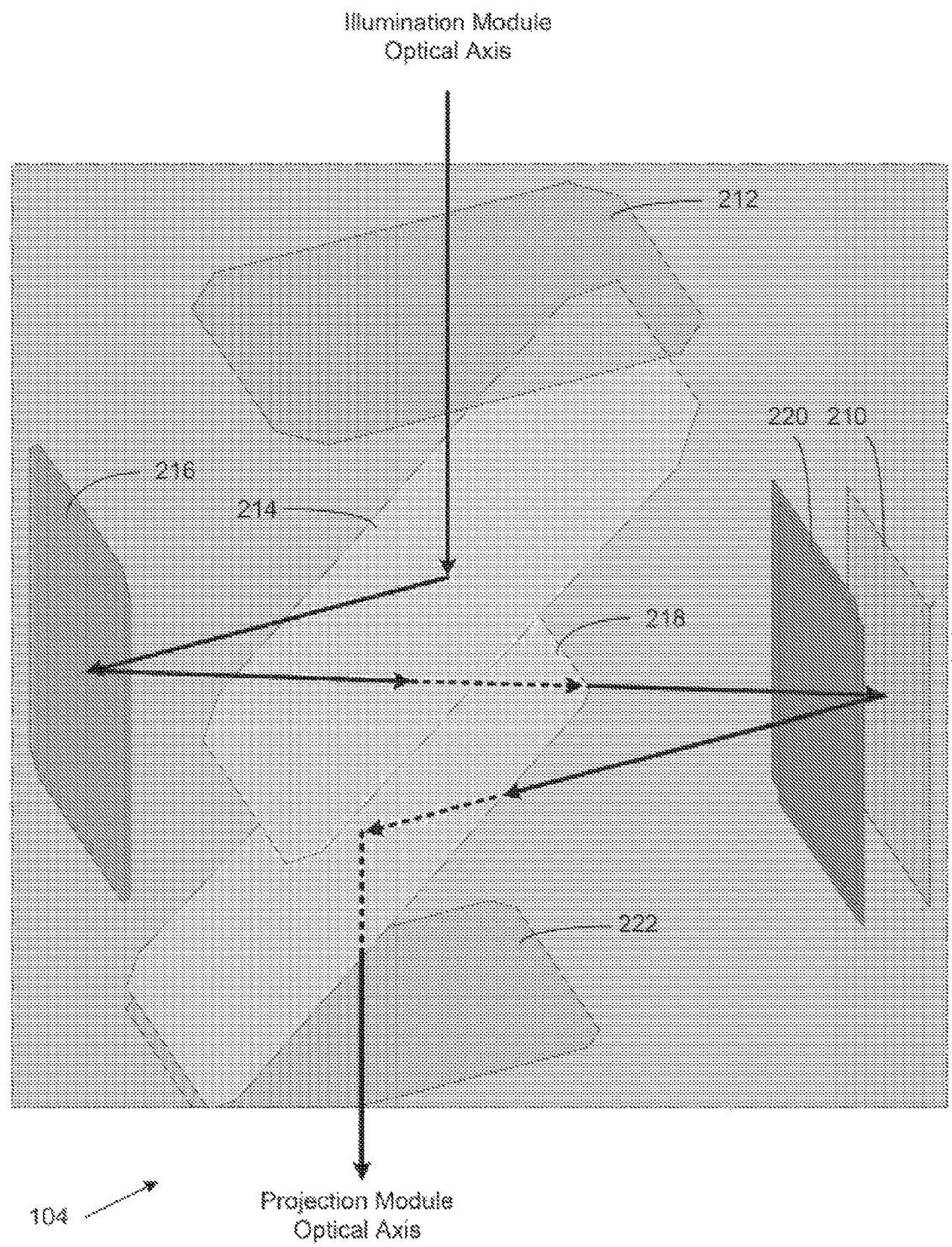
FIG. 2B illustrates an exemplary three-dimensional view of the illumination-projection beam separator of FIG. 2A according to embodiments of the present disclosure.
Figure 2C:
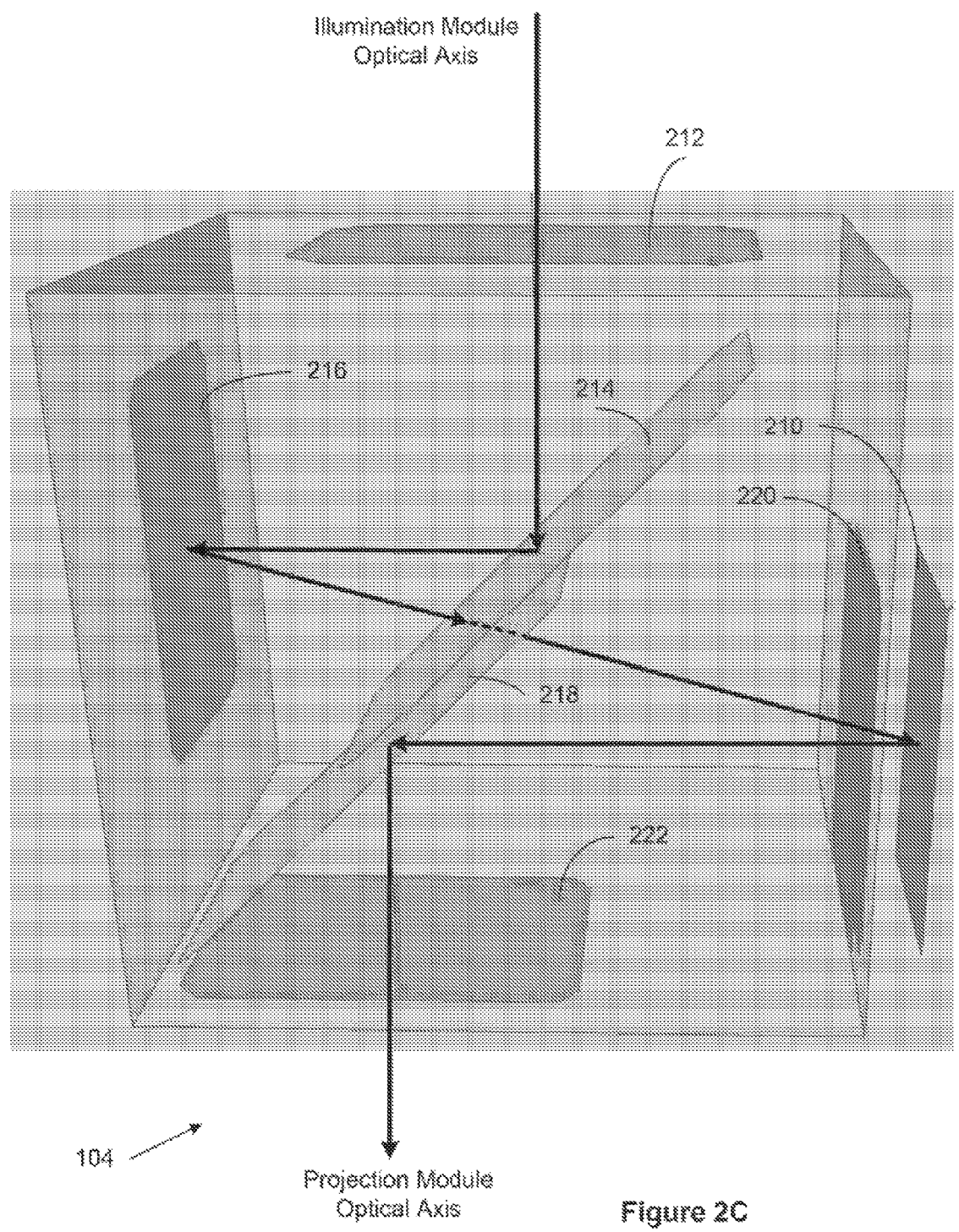
FIG. 2C illustrates another exemplary three-dimensional view of the illumination-projection beam separator of FIG. 2A according to embodiments of the present disclosure.

FIG. 2B illustrates an exemplary three-dimensional view of the illumination-projection beam separator of FIG. 2A according to embodiments of the present disclosure. As shown in FIG. 2B, the incoming illumination beam is incident on surface 212 at normal incidence and is transmitted directly to surface 214, which is oriented at 45° to the incoming beam and which has an air gap 206 on the other side. Consequently the incident beam is totally reflected from the air gap 206 and is incident on surface 216 at normal incidence. Surface 216 incorporates beam orientation adjustor 208 (not shown), which may be implemented as a blazed, reflective grating on its surface with lines oriented at 45° to the X or Z axis, and with a grating period and blaze direction oriented so that most of the incident light is diffracted at an angle to the normal equal to twice the tilt angle of DMD 210 and in the same plane of incidence as the tilt angle of DMD 210. After diffraction from the grating on surface 216, the beam is again incident on surface 214, the hypotenuse surface, only this time the incident angle on surface 214 is less than the critical angle so the beam is transmitted through surface 214 and also surface 218 and leaves the prism 204 through surface 220, after which it is incident on the DMD 210. Since the beam is incident on the DMD 210 at the right incident angle (for example approximately 24°) and in the same plane as the micro-mirror on-tilt angle, it is reflected normal to the DMD 210 and enters surface 220. After surface 220, the beam is incident of surface 218, but at an angle exceeding the critical angle so it is reflected from surface 218 and passes through surface 222 along the optical axis of the projection module 106. FIG. 2C illustrates another exemplary three-dimensional view of the illumination-projection beam separator of FIG. 2A according to embodiments of the present disclosure.

An alternate configuration that achieves much the same effect as the arrangement shown in FIG. 2A is shown in FIG. 3. As shown in FIG. 3, the incoming illumination beam is incident on surface 312 of prism 302 at normal incidence and is transmitted directly to surface 314, which is oriented at 45° to the incoming beam and which has an air gap 306 on the other side. Consequently the incident beam is totally reflected from the air gap 306 and is incident on surface 316 at normal incidence. Surface 316 incorporates beam orientation adjustor 308, which may be implemented as a wedge mirror with lines oriented at 45° to the X or Z axis, and with a direction oriented so that most of the incident light is diffracted at an angle to the normal equal to twice the tilt angle of DMD 310 and in the same plane of incidence as the tilt angle of DMD 310. After reflection from the mirror on surface 316, the beam is again incident on surface 314, the hypotenuse surface, only this time the incident angle on surface 314 is less than the critical angle so the beam is transmitted through surface 314 and also surface 318 and leaves the prism 304 through surface 320, after which it is incident on the DMD 310. Since the beam is incident on the DMD 310 at the right incident angle (for example approximately 24°) and in the same plane as the micro-mirror on-tilt angle, it is reflected normal to the DMD 310 and enters surface 320. After surface 320, the beam is incident of surface 318, but at an angle exceeding the critical angle so it is reflected from surface 318 and passes through surface 322 along the optical axis of the projection module 106.

In the example shown in FIG. 3, the beam orientation adjustor 208 (implemented as the blazed, reflective grating on surface 216) is replaced by a wedge mirror 308 oriented so that the steepest slope is at 45° to the X and Z-axis of FIG. 3. Thus the beam paths are substantially similar in FIGS. 2A and 3A and the beams are incident on the DMD 310 at identical compound angles.

In other implementations, the mirror surface on surface 316 can be incorporated into the piece forming the prism 302 or it can be added by attaching a thin wedge shaped mirror 308 to prism 302 as indicated by the dotted line in FIG. 3. Note that a person of ordinary skill in the art may appreciate that FIGS. 2A-2C and FIG. 3 are schematics intended to illustrate exemplary designs and may not be perfectly accurate representations of the path a light ray may travel through the many air-glass interfaces. In some cases the change of angle that occurs at an air-glass interface may not have been described.

Although the technique described above allows the tracing of rays from the end of the light pipe to the image plane of the projection module, the optical design program can be configured to handle one color at a time. Changing wavelength may be desirable such that the grating periods may also be changed. An alternative representation of both the DMD 210 and the reflective grating 208 may be a blazed, flat, Fresnel mirror with each facet equal to the size of a micro-mirror in the array, which is about 10.8 microns. One approach to implement this design is to replace the rotated, reflective grating with a flat mirror surface oriented at a compound angle such that the illumination axis may be reflected at an azimuth angle and incidence angle compatible with the DMD tilt mirrors.

Note that the illumination-projection beam separator 104 can introduce about 40 mm of glass on the projection side and about 80 mm of glass on the illumination side of the system. The NA may be low in this space so that the color that comes with converging beams and thick pieces of glass may be corrected.

According to aspects of the present disclosure, the 1× system is configured to be a substantially symmetrical system having a pupil located in the center between two doublets. This system has almost no coma or distortion because of the symmetry. In the event if symmetry may be compromised because of the introduction of the illumination-projection beam separator 104, a beam-splitter may be configured to extract light for alignment, and the window may be used to protect the rest of the optical train. In one implementation, a working distance of approximately 77 mm may be achieved with this design form.

The illumination module 102 may be substantially similar for both the 1× and 6× implementations of the projection module 106. It includes a compact 10× objective and a field lens, and produces a 0.011 NA, telecentric, and illumination field at the DMD. This NA may be considerably smaller than the 0.04 NA of the 1× and 6× projection systems resulting in a partial coherence factor of 0.275. This improves the slope of the image profile and improves the depth-of-field. In addition, it may be more forgiving of angular tilt errors in the micro-mirror array. Such an error tends to move the center of the illumination beam away from the center of the projection system pupil. To address the above issue, the design is configured to make the projected illumination pupil small with respect to the projection pupil, such that a larger deviation can be tolerated before vignetting compromises the image illumination uniformity. The illumination module 102 also includes two folding mirrors that considerably reduce the overall length to about 148 mm from the input end of the light pipe to the illumination-projection beam separator 104.

Note that the approximately 0.22 NA at the light pipe end of the illuminator relay may be available for fiber coupled laser diodes. This NA may be able to enable a reasonable number of bounces in order to homogenize the light at the output end. With this approach, the high magnification of the relay sets the cross-section size of the light pipe to about 2.1 mm by 1.2 mm.

With respect to the camera module 108, where the correction wavelengths may remain substantially the same as for the projection module 106, the field diameter can be approximately 6 mm, and the NA can be approximately 0.16. Note that in some implementations, the 1×SLM imaging units may be stacked close together in a single row that spanned the width of the substrate. This allows the camera module 108 to extend in a direction orthogonal to the projection module optical axis as far as needed without additional folds. In some other implementations, the 6×SLM imaging units may be stacked into a two-dimensional array and the optical path for the camera module 108 may be constrained. One solution is to use another folding prism right after the beam-splitter that separates the optical path of the camera module 108 from the optical path of the projection module 106. This can be accomplished by placing the beam-splitter in part of the optical path that is collimated so the effect on axial color can be minimized. A correction of about 0.03 lambda RMS may be achieved at the specified wavelengths for the 6× design.

Figure 4:
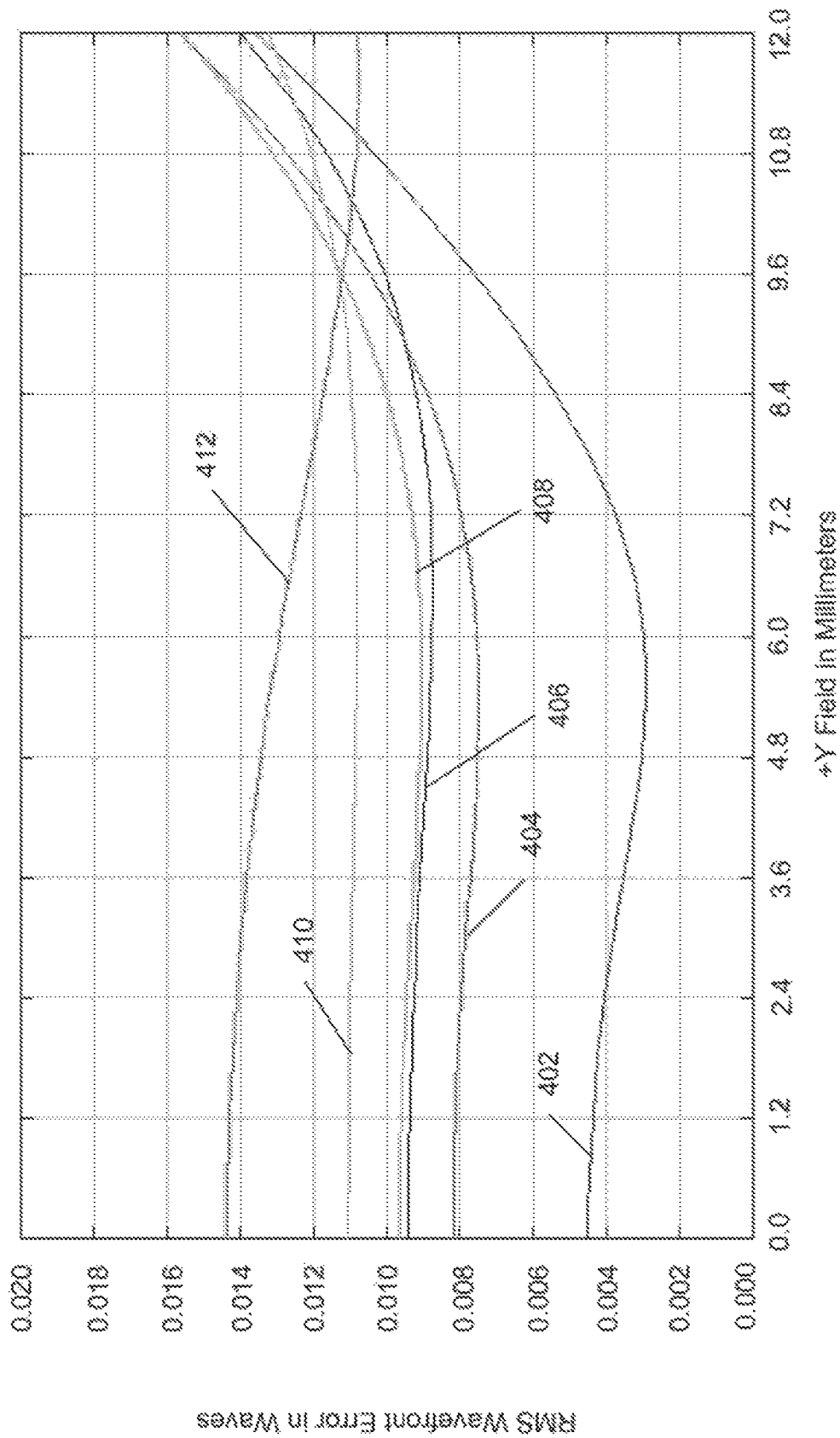
FIG. 4 illustrates a plot of RMS wavefront error vs. +Y field for a 1× projection optics according to embodiments of the present disclosure.

FIG. 4 illustrates a plot of RMS wavefront error vs. +Y field for a 1× projection optics according to embodiments of the present disclosure. In the example shown in FIG. 4, the horizontal axis represents +Y field in millimeters in the range from 0 to 12 millimeters. The vertical axis represents RMS wavefront error in waves in the range from 0 to 0.020. The RMS wavefront errors of the colors are shown. For example, curve 402 represents color blue, curve 404 represents color red, curve 406 represents color indigo, curve 408 represents color green, curve 410 represents color orange, and curve 412 represents color violet.

Figure 5:
FIG. 5 illustrates exemplary 6× projection optics cross-section according to embodiments of the present disclosure.

FIG. 5 illustrates exemplary 6× projection optics cross-section according to embodiments of the present disclosure. As shown in FIG. 5, various optical components are shown. A detailed list of the components is provided in Table 2 below. Table 2 describes the components of the 6× projection optics of FIG. 5 according to embodiments of the present disclosure.

TABLE 2

SURFACE DATA SUMMARY:

| Surf | Type | Radius | Thickness | Glass | Diameter | Conic | Comment |
|---|---|---|---|---|---|---|---|
| OBJ | STANDARD | Infinity | 6 | | 3.999985 | 0 | |
| 1 | STANDARD | Infinity | 1 | SUPRASIL | 6.966693 | 0 | |
| 2 | STANDARD | Infinity | 2 | | 7.302071 | 0 | |
| 3 | STANDARD | −11.63312 | 14.94394 | S-LAH65 | 7.945194 | 0 | |
| 4 | STANDARD | −40.91397 | 0.1 | | 16.77934 | 0 | |
| 5 | STANDARD | −46.77722 | 2.5 | S-BSM18 | 16.92844 | 0 | |
| 6 | STANDARD | 42.02167 | 5 | S-FPL53 | 19.56794 | 0 | |
| 7 | STANDARD | −25.9494 | 0.1 | | 20.87682 | 0 | |
| 8 | STANDARD | 391.3741 | 3.5 | S-FPL53 | 22.72886 | 0 | |
| 9 | STANDARD | −41.99294 | 0.1 | | 23.52602 | 0 | |
| 10 | STANDARD | 52.45408 | 4 | S-FPL53 | 24.96397 | 0 | |
| 11 | STANDARD | −64.44142 | 0.1 | | 25.13682 | 0 | |
| 12 | STANDARD | 43.40388 | 3.5 | S-FPL53 | 25.20843 | 0 | |
| 13 | STANDARD | −107.849 | 0.1 | | 25.0551 | 0 | |
| 14 | STANDARD | 28.86787 | 5 | S-FPL53 | 23.83517 | 0 | |
| 15 | STANDARD | −122.2302 | 2 | SUPRASIL | 22.85031 | 0 | |
| STO | STANDARD | 17.85497 | 45.572 | | 20.00163 | 0 | |
| 17 | STANDARD | Infinity | 25 | SUPRASIL | 14.21682 | 0 | |
| 18 | STANDARD | Infinity | 10.62439 | | 16.40614 | 0 | |
| 19 | STANDARD | 276.6007 | 5 | S-FPL53 | 17.77596 | 0 | |
| 20 | STANDARD | −23.34284 | 4 | S-BAL41 | 17.98696 | 0 | |
| 21 | STANDARD | −79.7 | 156.7214 | | 18.65613 | 0 | |
| 22 | STANDARD | 203.1093 | 3.5 | S-FTM16 | 29.64208 | 0 | |
| 23 | STANDARD | 67.36893 | 6 | S-LAH55 | 29.58431 | 0 | |
| 24 | STANDARD | 517.8979 | 35.65827 | | 29.26589 | 0 | |
| 25 | STANDARD | Infinity | 40 | S-BSL7 | 26.38255 | 0 | |
| 26 | STANDARD | Infinity | 0.5 | | 24.25776 | 0 | |
| 27 | STANDARD | Infinity | 2.997 | S-FSL5 | 24.21709 | 0 | |
| 28 | STANDARD | Infinity | 0.483 | | 24.05461 | 0 | |
| IMA | STANDARD | Infinity | | | 24.02078 | 0 | |

Figure 6:
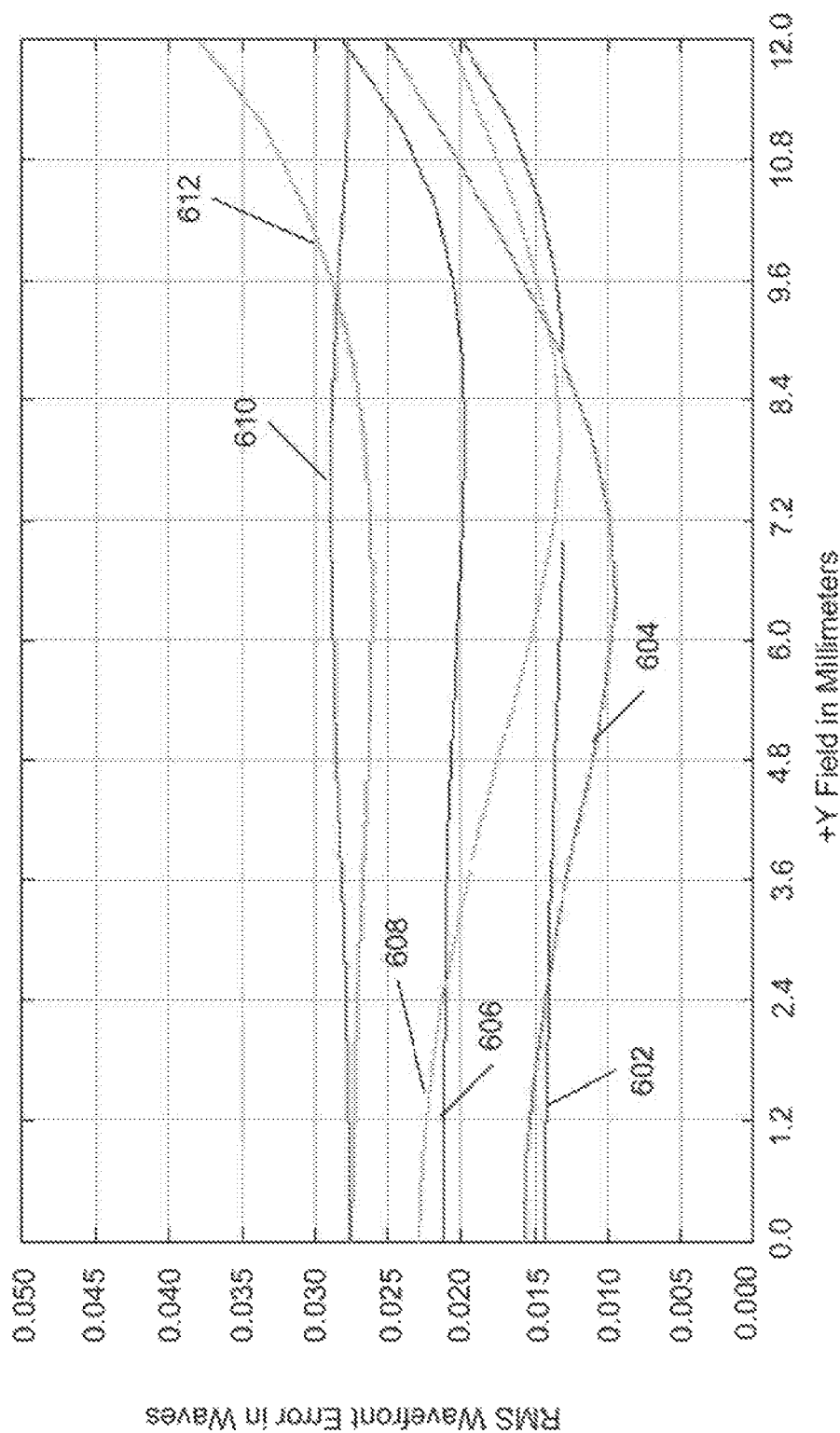
FIG. 6 illustrates a plot of RMS wavefront error vs. +Y field for the 6× projection optics of FIG. 5 according to embodiments of the present disclosure.

FIG. 6 illustrates a plot of RMS wavefront error vs. +Y field for the 6× projection optics of FIG. 5 according to embodiments of the present disclosure. In the example shown in FIG. 6, the horizontal axis represents +Y field in millimeters in the range from 0 to 12 millimeters. The vertical axis represents RMS wavefront error in waves in the range from 0 to 0.050. The RMS wavefront errors of the colors are shown. For example, curve 602 represents color blue, curve 604 represents color violet, curve 606 represents color indigo, curve 408 represents color orange, curve 610 represents color red, and curve 612 represents color green.

FIG. 7 illustrates exemplary 6× camera optics according to embodiments of the present disclosure. As shown in FIG. 7, various optical components are shown. A detailed list of the components is provided in Table 3 below. Table 3 describes the 6× camera optics of FIG. 7 according to embodiments of the present disclosure.

TABLE 3

SURFACE DATA SUMMARY:

| Surf | Type | Radius | Thickness | Glass | Diameter | Conic |
|---|---|---|---|---|---|---|
| OBJ | STANDARD | Infinity | 6 | | 3.999957 | 0 |
| 1 | STANDARD | Infinity | 1 | SUPRASIL | 6.966665 | 0 |
| 2 | STANDARD | Infinity | 2 | | 7.302043 | 0 |
| 3 | STANDARD | −11.63312 | 14.94394 | S-LAH65 | 7.945167 | 0 |
| 4 | STANDARD | −40.91397 | 0.1 | | 16.77929 | 0 |
| 5 | STANDARD | −46.77722 | 2.5 | S-BSM18 | 16.9284 | 0 |
| 6 | STANDARD | 42.02167 | 5 | S-FPL53 | 19.56788 | 0 |
| 7 | STANDARD | −25.9494 | 0.1 | | 20.87678 | 0 |
| 8 | STANDARD | 391.3741 | 3.5 | S-FPL53 | 22.7288 | 0 |
| 9 | STANDARD | −41.99294 | 0.1 | | 23.52596 | 0 |
| 10 | STANDARD | 52.45408 | 4 | S-FPL53 | 24.96391 | 0 |
| 11 | STANDARD | −64.44142 | 0.1 | | 25.13676 | 0 |
| 12 | STANDARD | 43.40388 | 3.5 | S-FPL53 | 25.20837 | 0 |
| 13 | STANDARD | −107.849 | 0.1 | | 25.05503 | 0 |
| 14 | STANDARD | 28.86787 | 5 | S-FPL53 | 23.83512 | 0 |
| 15 | STANDARD | −122.2302 | 2 | SUPRASIL | 22.85026 | 0 |
| STO | STANDARD | 17.85497 | 45.572 | | 20.00159 | 0 |
| 17 | STANDARD | Infinity | 50 | SUPRASIL | 14.21682 | 0 |
| 18 | STANDARD | Infinity | 0.1 | | 18.59543 | 0 |
| 19 | STANDARD | 51.42428 | 6 | S-FPL51 | 18.7174 | 0 |
| 20 | STANDARD | −13.61537 | 2 | SUPRASIL | 18.6639 | 0 |
| 21 | STANDARD | −58.72156 | 4.016346 | | 18.20835 | 0 |
| 22 | STANDARD | −26.85794 | 4 | S-TIM1 | 17.28783 | 0 |
| 23 | STANDARD | −12.60856 | 2 | S-LAM55 | 17.45899 | 0 |
| 24 | STANDARD | −75.4502 | 7.048056 | | 18.55384 | 0 |

TABLE 3-continued

SURFACE DATA SUMMARY:

| Surf | Type | Radius | Thickness | Glass | Diameter | Conic |
|---|---|---|---|---|---|---|
| 25 | STANDARD | 231.0992 | 4 | S-FPL53 | 20.14024 | 0 |
| 26 | STANDARD | −26.20011 | 24.38191 | | 20.3371 | 0 |
| 27 | STANDARD | 30.26877 | 25 | S-FSL5 | 14.71653 | 0 |
| 28 | STANDARD | 10.80071 | 1.097512 | | 7.289978 | 0 |
| 29 | STANDARD | 8.250533 | 2.236983 | S-LAL18 | 7.161331 | 0 |
| 30 | STANDARD | 10.52782 | 1 | | 6.294749 | 0 |
| 31 | STANDARD | Infinity | 0.4 | S-BSL7 | 6.123171 | 0 |
| 32 | STANDARD | Infinity | 0.125 | | 6.036451 | 0 |
| IMA | STANDARD | Infinity | | | 6.004747 | 0 |

Figure 8:
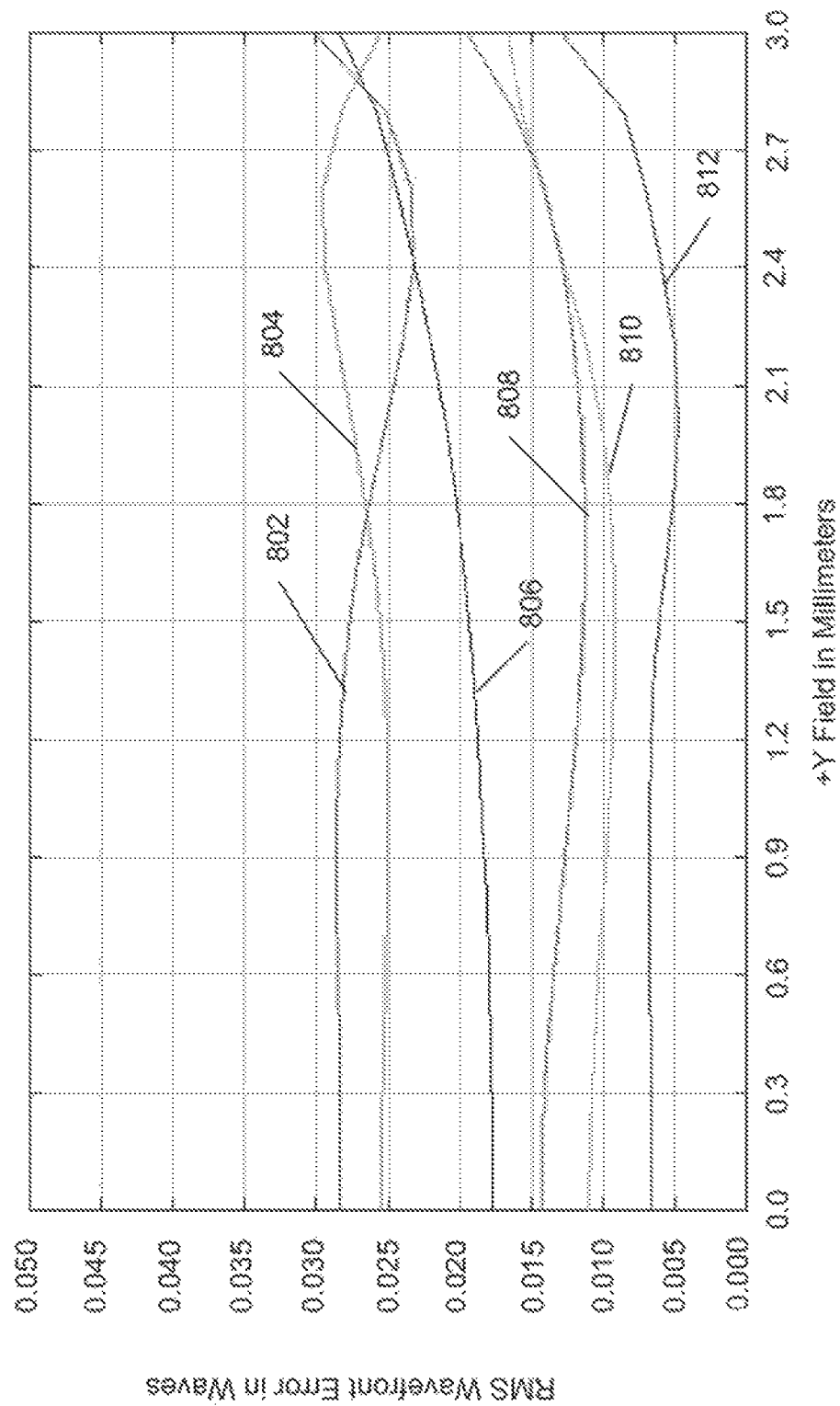
FIG. 8 illustrates a plot of RMS wavefront error vs. +Y field for the 6× camera optics of FIG. 7 according to embodiments of the present disclosure.

FIG. 8 illustrates a plot of RMS wavefront error vs. +Y field for the 6× camera optics of FIG. 7 according to embodiments of the present disclosure. In the example shown in FIG. 4, the horizontal axis represents +Y field in millimeters in the range from 0 to 3.0 millimeters. The vertical axis represents RMS wavefront error in waves in the range from 0 to 0.050. The RMS wavefront errors of the colors are shown. For example, curve 802 represents color red, curve 804 represents color green, curve 806 represents color indigo, curve 808 represents color violet, curve 810 represents color orange, and curve 812 represents color indigo.

Figure 9:
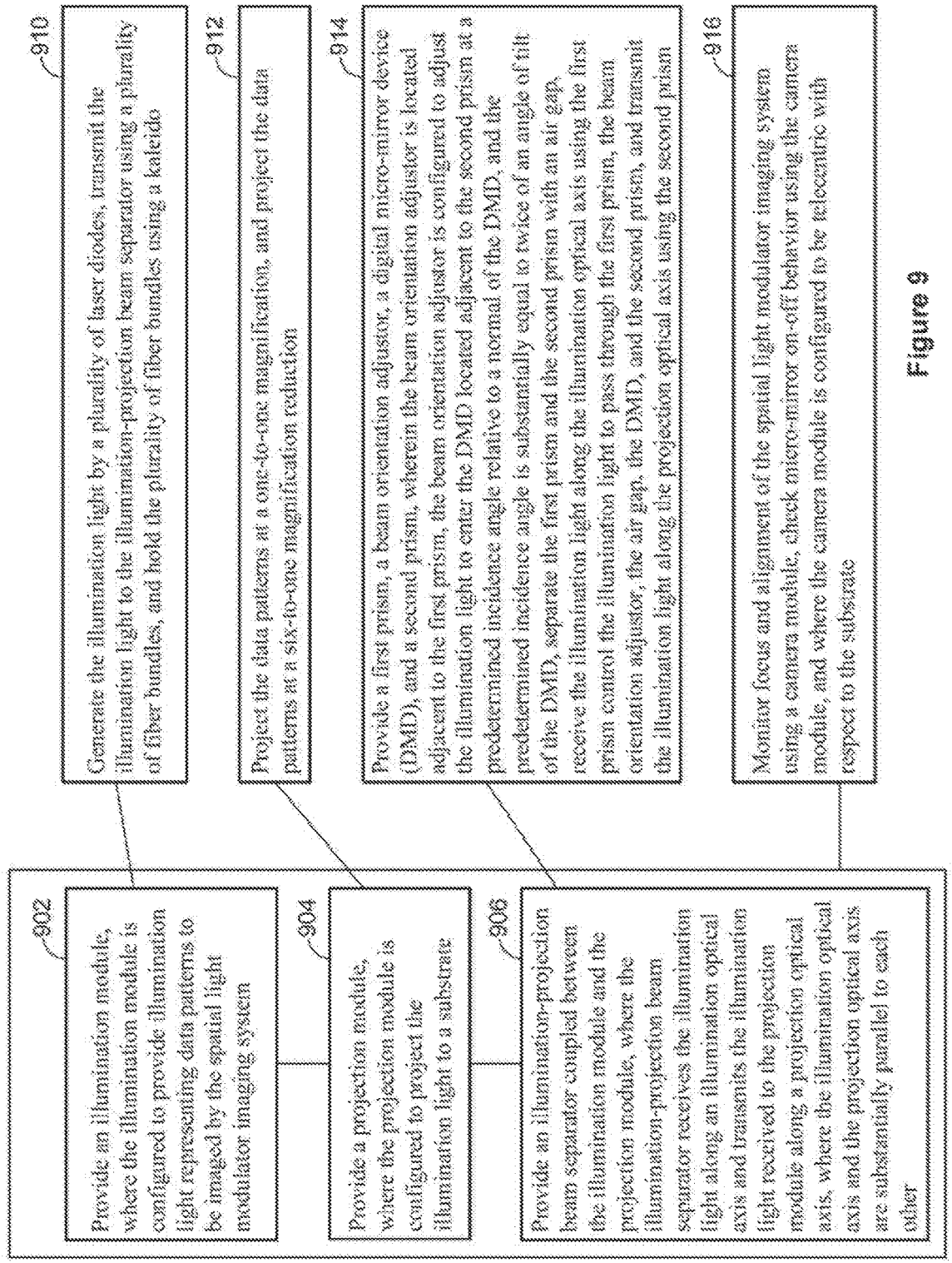
FIG. 9 illustrates a method of forming a spatial light modulator imaging system according to some embodiments of the present disclosure.

FIG. 9 illustrates a method of forming a spatial light modulator imaging system according to some aspects of the present disclosure. Certain functions of the method may be implemented by one or more processors. In block 902, the method provides an illumination module, where the illumination module is configured to provide illumination light representing data patterns to be imaged by the spatial light modulator imaging system. In block 904, the method provides a projection module, where the projection module is configured to project the illumination light to a substrate. In block 906, the method provides an illumination-projection beam separator coupled between the illumination module and the projection module, where the illumination-projection beam separator is configured to receive the illumination light along an illumination optical axis and transmit the illumination light received to the projection module along a projection optical axis, and where the illumination optical axis and the projection optical axis are substantially parallel to each other. Note that, the illumination module can be configured to be telecentric with respect to the illumination light, and the projection module can be configured to be telecentric with respect to the substrate.

According to embodiments of the present disclosure, the methods performed in block 902 may further include methods performed in block 910. Methods performed in block 904 may further include methods performed in block 912. Methods performed in block 906 may further include methods performed in block 914. In block 910, the method generates the illumination light by a plurality of laser diodes, transmits the illumination light to the illumination-projection beam separator using a plurality of fiber bundles, and holds the plurality of fiber bundles using a kaleido. In block 912, the method projects the data patterns at a one-to-one magnification and/or projects the data patterns at a six-to-one magnification reduction.

In block 914, the method provides a first prism, a beam orientation adjustor, a digital micro-mirror device (DMD), and a second prism, where the beam orientation adjustor is located adjacent to the first prism, the beam orientation adjustor is configured to adjust the illumination light to enter the DMD located adjacent to the second prism at a predetermined incidence angle relative to a normal of the DMD, and the predetermined incidence angle is substantially equal to twice of an angle of tilt of the DMD, and the method separate the first prism and the second prism with an air gap. In addition, the method receive the illumination light along the illumination optical axis using the first prism, controls the illumination light to pass through the first prism, the beam orientation adjustor, the air gap, the DMD, and the second prism, and transmits the illumination light along the projection optical axis using the second prism.

According to aspects of the present disclosure, the first prism comprises a first right angle prism, where the first right angle prism includes a first surface configured to receive the illumination light at approximately normal incidence; a second surface configured to receive the illumination light at approximately 45 degree angle and to cause the illumination light to be substantially reflected at the second surface; a third surface coupled to the beam orientation adjustor, wherein the third surface and the beam orientation adjustor are configured to cause the illumination light to pass through the second surface and the air gap at the predetermined incidence angle.

According to aspects of the present disclosure, the second prism comprises a second right angle prism, where the second right angle prism includes a first surface configured to receive the illumination light from the first prism; a second surface configured to pass the illumination light to the DMD and receive the illumination light reflected from the DMD; the first surface is further configured to substantially reflect the illumination light reflected from the DMD; a third surface configured to transmit the illumination light reflected from the first surface along the projection optical axis. The air gap has a dimension in a range of 0.005 millimeter to 0.015 millimeter.

According to aspects of the present disclosure, the beam orientation adjustor comprises at least one of a wedge mirror having a thickness of approximately 4.67 millimeters at a first end, having a thickness of approximately 2.18 millimeters at a second end, and having a slope of approximately 5.47°; and a reflective grating coating formed with an inorganic MgF2 coating, having a thickness of larger than ten times of a corresponding exposure wavelength of the spatial light modulator imaging system.

According to aspects of the present disclosure, in block 916, the method monitors focus and alignment of the spatial light modulator imaging system using a camera module, and checks micro-mirror on-off behavior using the camera module, where the camera module is configured to be telecentric with respect to the substrate.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The method and system of the present disclosure can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. An illumination-projection assembly, comprising:
   a first prism, wherein the first prism comprises:
      a first surface;
      a second surface; and
      a first hypotenuse; and
   a second prism, wherein the second prism comprises:
      a third surface;
      a fourth surface;
      a second hypotenuse; wherein the first hypotenuse and the second hypotenuse are facing one another, and wherein the first hypotenuse and the second hypotenuse are separated by an air gap; and
      a digital micro-mirror device adjacent the third surface, the digital micro-mirror device having a width less than a width of the third surface, and having a midpoint of the width that is vertically offset from a midpoint of the width of the third surface.

2. The illumination-projection assembly of claim 1, wherein the first surface and the fourth surface are parallel to one another.

3. The illumination-projection assembly of claim 1, wherein the second surface and the third surface are parallel to one another.

4. The illumination-projection assembly of claim 1, wherein the second surface is sloped.

5. An illumination-projection assembly, comprising:
   a first prism, wherein the first prism comprises:
      a first surface;
      a second surface;
      a grating surface, wherein the grating surface is on and in contact with the second surface; and
      a first hypotenuse; and
   a second prism, wherein the second prism comprises:
      a third surface;
      a fourth surface;
      a second hypotenuse; wherein the first hypotenuse and the second hypotenuse are facing one another, and wherein the first hypotenuse and the second hypotenuse are separated by an air gap; and
      a digital micro-mirror device adjacent the third surface, the digital micro-mirror device having a width less than a width of the third surface, and having a midpoint of the width that is vertically offset from a midpoint of the width of the third surface.

6. The illumination-projection assembly of claim 5, wherein the first surface and the fourth surface are parallel to one another.

7. The illumination-projection assembly of claim 5, wherein the second surface and the third surface are parallel to one another.

8. The illumination-projection assembly of claim 5, wherein the grating surface is a blazed grating surface.

9. The illumination-projection assembly of claim 5, wherein the grating surface comprises lines oriented at 45° to an X or a Z axis.

10. The illumination-projection assembly of claim 5, wherein the air gap is between about 0.005 millimeters and about 0.015 millimeters.

11. An illumination-projection assembly, comprising:
    a first prism, wherein the first prism comprises:
       a first surface;
       a second surface;
       a wedge mirror, wherein the wedge mirror is on and in contact with the second surface; and
       a first hypotenuse; and
    a second prism, wherein the second prism comprises:
       a third surface;
       a fourth surface;
       a second hypotenuse; wherein the first hypotenuse and the second hypotenuse are facing one another, and wherein the first hypotenuse and the second hypotenuse are separated by an air gap; and
       a digital micro-mirror device adjacent the third surface, the digital micro-mirror device having a width less than a width of the third surface, and having a midpoint of the width that is vertically offset from a midpoint of the width of the third surface.

12. The illumination-projection assembly of claim 11, wherein the first surface and the fourth surface are parallel to one another.

13. The illumination-projection assembly of claim 11, wherein the second surface and the third surface are parallel to one another.

14. The illumination-projection assembly of claim 11, wherein the wedge mirror comprises lines oriented at 45° to an X or a Z axis.

15. The illumination-projection assembly of claim 11, wherein the air gap is between about 0.005 millimeters and about 0.015 millimeters.

* * * * *